United States Patent [19]

Wang et al.

[11] 4,223,434
[45] Sep. 23, 1980

[54] METHOD OF MANUFACTURING A NIOBIUM-ALUMINUM-GERMANIUM SUPERCONDUCTIVE MATERIAL

[75] Inventors: John L. Wang, San Francisco; Milton R. Pickus, Oakland; Kent E. Douglas, Redondo Beach, all of Calif.

[73] Assignee: The United States of America as represented by the United States Department of Energy, Washington, D.C.

[21] Appl. No.: 8,622

[22] Filed: Feb. 1, 1979

[51] Int. Cl.$^2$ .......................... H01V 11/00; B22F 3/24
[52] U.S. Cl. ............................... 29/599; 148/11.5 F; 428/662; 29/420.5; 75/208 CS; 148/11.5 P
[58] Field of Search ...................... 29/599, 420.5, 420; 148/11.5 F, 11.5 R, 133, 11.5 P, 11.5 Q; 75/208 R, 208 CS; 428/674, 662, 660

[56] References Cited

U.S. PATENT DOCUMENTS

| | | | |
|---|---|---|---|
| 3,815,224 | 6/1974 | Pinkus | 29/420.5 |
| 4,018,942 | 4/1977 | Muller et al. | 29/599 |

Primary Examiner—Francis S. Husar
Assistant Examiner—V. K. Rising
Attorney, Agent, or Firm—James E. Denny; Roger S. Gaither; William S. Bernheim

[57] ABSTRACT

A method for manufacturing flexible $Nb_3(Al,Ge)$ multi-filamentary superconductive material in which a sintered porous niobium compact is infiltrated with an aluminum-germanium alloy and thereafter deformed and heat treated in a series of steps at different successively higher temperatures preferably below 1000° C. to produce filaments composed of $Nb_3(Al,G3)$ within the compact. By avoiding temperatures in excess of 1000° C. during the heat treatment, cladding material such as copper can be applied to facilitate a deformation step preceding the heat treatment and can remain in place through the heat treatment to also serve as a temperature stabilizer for supeconductive material produced. Further, these lower heat treatment temperatures favor formation of filaments with reduced grain size and, hence with more grain boundaries which in turn increase the current-carrying capacity of the superconductive material.

10 Claims, 1 Drawing Figure

METHOD OF MANUFACTURING A NIOBIUM-ALUMINUM-GERMANIUM SUPERCONDUCTIVE MATERIAL

BACKGROUND OF THE INVENTION

The invention described herein was made in the course of, or under, Department of Energy Contract No. W-7405-ENG-48 with the University of California.

This invention relates to an improved method for manufacturing a flexible $Nb_3$ (Al, Ge) superconductive material.

U.S. Pat. No. 3,815,224 discloses a method for manufacturing a number of different superconductive materials including a niobium strip containing interconnecting filaments of superconducting A15 phase $Nb_3$ (Al, Ge). The process steps of this patented method include forming a porous niobium strip, sintering, infiltrating the pores of the strip with an alluminum-germanium eutectic alloy (approximately 30 atomic percent germanium) to form a composite, reducing the thickness of the composite, and a single step diffusion heat treatment of the composite.

The quality of the $Nb_3$ (Al, Ge) superconductor material producible with this patented method is limited. The filament, referred to as A15 phase, is aluminum deficient because aluminum rapidly diffuses into the niobium matrix during the heat treatment.

Furhter during the heat treatment, the temperatures are such, typically at least 1000° C., that metal claddings, such as of copper, cannot be in place over the niobium composite during the heat treatment. At the temperatures employed in the patented method, the cladding is subject to softening and melting. However, the presence of a cladding facilitates the thickness reduction step preceding the heat treatment and, subsequent to the heat treatment, the presence of a cladding serves to temperature stabilize the superconductive material by acting as a heat sink. As a further consideration, lower temperatures during the heat treatment will result in A15 phase filaments of smaller grain size and, hence, a greater number of flux-pinning centers that increase the current carrying capacities.

SUMMARY OF THE INVENTION

In the present invention a three stage heat treatment is employed to provide a flexible $Nb_3$ (Al, Ge) superconductive material. Basically, the invention involves the steps of forming a porous bar from niobium powder, sintering the bar; infiltrating the pores of the bar with an aluminum-germanium alloy to form a composite; deforming the composite to reduce thickness and mechanically elongate the infiltrant; and heat treating the composite. The heat treatment step includes multiple heatings. The composite is first heated to a first temperature to change the infiltrated Al-Ge alloy from a lamellar structure to a phase made up almost entirely of germanium. Concurrently aluminum of the alloy reacts with the niobium to form an aluminum, rich phase. The composite is further heated to a second higher temperature to accomplish two changes: germanium reacts with niobium to form a germanium rich phase and this phase forms around the aluminum rich phase. The composite is now further heated to a third even higher temperature to form interconnecting superconducting A15 phase $Nb_3$ (Al, Ge) filaments running through the composite. The amount and quality of the superconducting A15 phase can be varied by controlling the treatment times and temperatures of the heating steps.

Hence, it is an object of the invention to provide an improved method for manufacturing $Nb_3$ (Al, Ge) superconductive material.

A further object of the invention is to provide a method for forming a $Nb_3$ (Al, Ge) superconductive material having filaments with a small grain size.

A yet further object is to provide a method employing temperatures which allow a cladding of ductile metal to be in place on the niobium composite during the heat treatment.

Other objects of the invention will become readily apparent from the following description and accompanying drawing.

DESCRIPTION OF THE PREFERRED EMBOIDMENT

Figure 1:
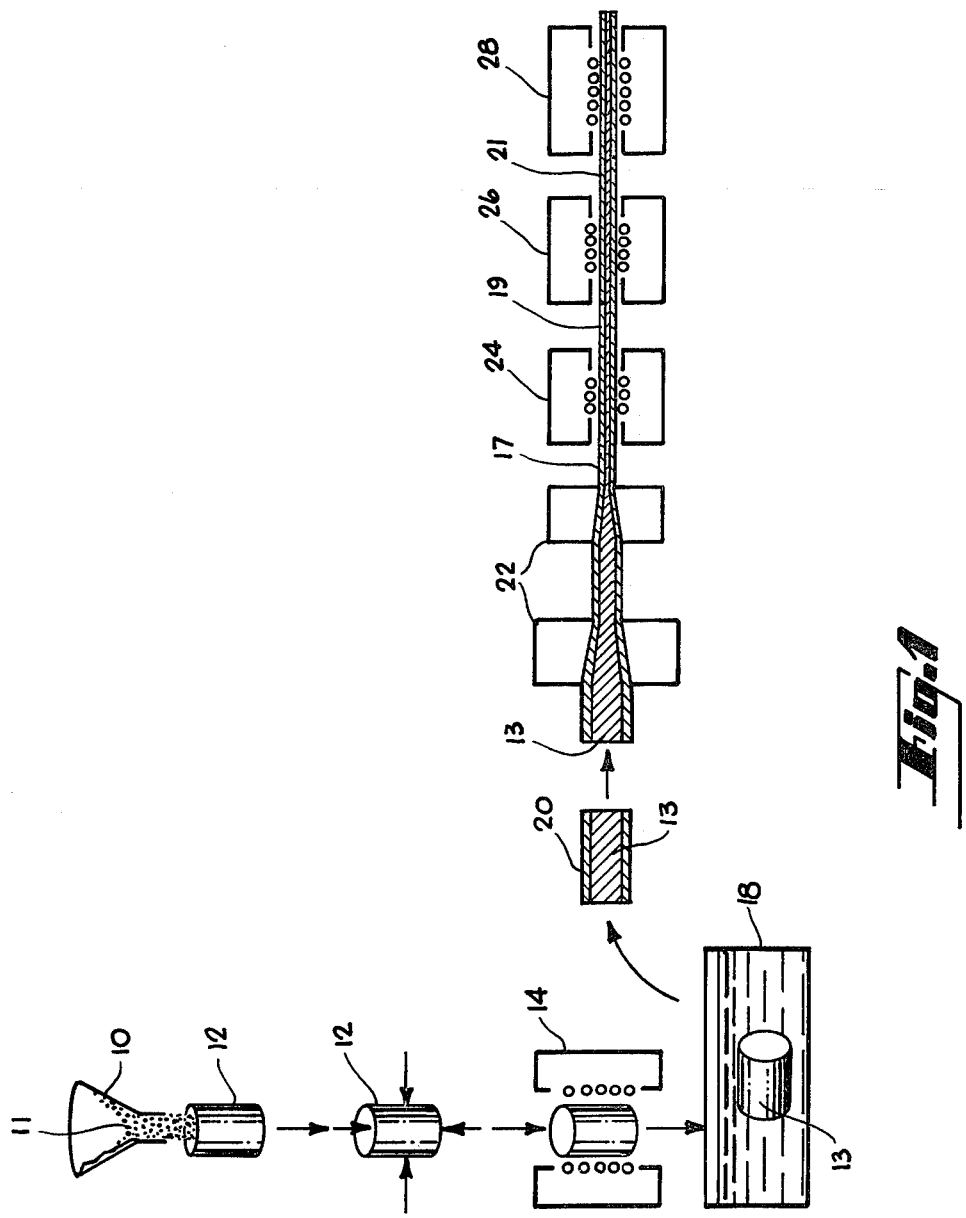
FIG. 1 is a schematic illustration of an apparatus for carrying out in operational sequence the steps for making $Nb_3$ (Al, Ge) superconductive material in accordance with the invention.

An embodiment of an apparatus is illustrated schematically in FIG. 1 for carrying out the operational sequence for manufacturing the $Nb_3$ (Al, Ge) superconductive material of this invention. While the illustrated process is of the non-continuous type, it can be modified for continuous-type production.

A hopper 10 contains finely powdered niobium 11 of particle size ranging from $-270$ mesh to $+400$ mesh. From the hopper 10 niobium powder 11 is placed in a flexible mold 12 and the ends sealed. The mold is then cold isostatically compacted at a pressure of about 2,100 kg/sq. cm for about 1 minute to form a porous niobium compact in the form of a cylinder or rod which is then removed from the mold 12.

Alternatively in a continuous process, for example, a porous niobium strip or tape can be produced by passing niobium powder between compacting rollers. For 5 cm diameter rollers and a roller gap of 0.03 cm, a strip having a thickness of about 0.038 cm can be expected.

The compact is passed through a sintering furnace 14 to reduce in a controlled manner the porosity of the compact and to give ductility to the compact. In the sintering furnace 14, the compact is heated under a vacuum or an inert gas atmosphere to a temperature in the range of 1,850°–2,350° C. The residence time for a small compact is of the order of minutes. The sintering produces a compact which has interconnected pores and a porosity which can be controlled over a considerable range.

After cooling, the sintered compact is passed through a molten Al-Ge alloy bath 18. The cooling of the sintered compact is to a temperature approximating that of the bath 18 to avoid chemical reaction between the molten Al-Ge alloy and the niobium compact. In the bath 18 the porous niobium 13 is infiltrated (pores filled) with Al-Ge alloy, the infiltrant, to form a composite.

The temperature of the molten Al-Ge alloy bath is in the range of about 500° C.–1000° C. and preferably less than about 650° C. The low temperature is set by the melting point of the Al-Ge alloy and the high temperature is set to avoid reaction between the Nb, Al and Ge. Viscosity decreases with temperature and low viscosity (higher temperatures) is desirable because the rate of the infiltration is increased. Neither the molten alloy nor the incoming compact is exposed to the atmosphere. The immersion time of the compact in the bath is in the range of a few seconds to several minutes. The composition of the molten alloy can vary from about 70-80 atomic % Al with 30-20% Ge. Preferably, the molten alloy is about 70% Al - 30% Ge, the eutectic proportion, i.e., the lowest melting point.

Following the infiltration, optionally and preferably, the formed composite is clad in a conventional manner with one or more ductile metals. The cladding can include an inner cladding of tantalum, which serves as a diffusion barrier to the migration of aluminum, and an outer cladding of copper, which facilitates mechanical thickness reduction of the composite and provides stability to the superconductive material produced. Stability is provided in that the cladding conducts away heat from the superconductive material and, thus, reduces the risk of localized overheating which results in breakdown of the superconductivity. One suitable technique for cladding the composite, when as here the composite is in the form of a rod, is to insert the composite 13 into a tube 20 of the cladding material. For cladding with more than one metal, the composite can be inserted into a tube within a tube.

Following the cladding step or the infiltration step, if cladding is not employed, the composite 13 is deformed by passage through a mechanical size-reduction mechanism 22. Area reduction ratios on the order of 400 are typical.

This deformation step elongates the infiltrant alloy so that the alloy extends as filaments through the compsoite 17. This reduction in thickness also reduces the reaction times of the subsequent heat treatment steps.

The deformed composite 17 is subjected to a heat treatment which is separated into three steps in which the composite is heated at successively higher temperatures. To begin the treatment, the composite 17 is heated in a first diffusion furnace 24. In this first furnace 24 the composite 17 is raised to a temperature of about 600° C. for about one hour. This first heating step accomplishes several changes in the composite. First, the infiltrated Al-Ge alloy changes from its original lamellar structure to form into two phases. A first phase A is composed almost entirely of germanium. A second aluminum-rich phase B is composed, as the result of infiltrated aluminum reacting with the niobium, of about 18.9% Nb, 79.1% Al, and 2% Ge. This phase B forms around the periphery of the germanium phase A and remains relatively stable even after 8 hours at 600° C.

The composite 19 is then heated in a second diffusion furnace 26. In this second furnace 26 the composite is raised to a temperature of about 750° C. for about 5 minutes. This second heating step accomplishes several changes in the composite 19. First, germanium reacts with niobium to form a phase C in the composite having a composition of about 25.6% Nb, 24.7% Al and 49.7% Ge. Further, this germanium-rich phase C forms around the periphery of the previously formed aluminum-rich phase B. This phase C serves to limit the rate at which aluminum diffuses from the aluminum-rich phase B during the subsequent heating step.

The composite 21 is now heated in a third diffusion furnace 28. In this third furnace 28 the composite is raised to a temperature in the range of about 850° C. to about 1000° C. for a period of several hours. The about 850° C. temperature is preferred. The purpose of this step is to form Al5 phase at the interface between phase C and the surrounding niobium by a reaction based on the diffusion of aluminum through the phase C. The Al5 superconductive filaments thus formed have a composition of about 62.6% Nb, 32.7% Al and 4.7% Ge. In samples, tested thus far, the highest temperature at which superconductivity occurs is after about 18 hours of heating at 1000° C. or after about 72 hours of heating at 850° C.

Thus a method has been disclosed for manufacture of a flexible multifilamentary $Nb_3$ (Al, Ge) superconductive material. This method is an improvement over previous methods in that the manufacture can be accomplished at temperatures which enhance the current-carrying capacity and which allow the employment of a cladding material which can remain in place during the heating steps of the method.

Although a particular apparatus and operation sequence has been illustrated for producing the novel superconductive material, it is not intended to limit the method of manufacture to the specifically disclosed operational sequence of the illustrated apparatus as modifications and changes are within the skill of persons in the art. The appended claims are intended to cover all such modifications and changes as come within the spirit and scope of the invention.

What is claimed is:

1. A method for manufacturing a flexible superconductive material containing interconnecting filaments of a $Nb_3$ (Al, Ge) superconductive phase comprising the steps of:
   a. forming a porous niobium compact having a network of interconnecting pores;
   b. sintering the thus formed niobium compact;
   c. infiltrating into the interconnecting pores of the sintered compact an aluminum-germanium alloy by passing the sintered compact through a molten bath of the alloy so that the alloy infiltrates into and substantially fills the pores of the sintered compact to form a composite;
   d. deforming the composite to elongate infiltrant alloy so that the alloy extends as filaments through the composite;
   e. first, heating the deformed composite to a temperature sufficient to cause the infiltrated alloy to react with niobium and separate into two phases, one, which is composed almost entirely of germanium and another, which is peripheral to the germanium phase and is composed basically of aluminum reacted with niobium;
   f. second, heating the composite to a second higher temperature so that a germanium-rich germanium-aluminum-niobium phase is formed peripheral to the aluminum-niobium phase, and;
   g. third, heating the composite to a third temperature higher than the second temperature such that aluminum diffuses through the germanium rich phase and forms a $Nb_3$ (Al, Ge) superconductive phase peripheral to the germanium phase.

2. A method according to claim 1 wherein the temperature to which the composite is raised in the third heating is at least 850° C.

3. A method according to claim 2 wherein the temperature to which the composite is raised in the third heating is about 850° C.

4. A method according to claim 1 wherein the temperature to which the composite is raised in the second heating is about 750° C.

5. A method according to claim 1 wherein the temperature to which the composite is raised in the first heating is about 600° C.

6. A method according to claim 2 wherein the temperature to which the composite is raised in the second heating is about 750° C. and the temperture to which the composite is raised in the first heating is about 600° C.

7. A method according to claim 1 further including the step of cladding the composite with a ductile metal between the infiltrating step and the deforming step.

8. A method according to claim 7 wherein the cladding metal is copper.

9. A method according to claim 7 wherein the cladding metal is tantalum which functions as a diffusion barrier.

10. A method according to claim 7 wherein the cladding includes an inner cladding of tantalum and an outer cladding of copper.

* * * * *